United States Patent
Corsi et al.

(10) Patent No.: US 10,654,145 B2
(45) Date of Patent: May 19, 2020

(54) METHODS AND SYSTEMS FOR POLISHING PAD CONTROL

(71) Applicant: SunEdison Semiconductor Limited (UEN201334164H), Singapore (SG)

(72) Inventors: Emanuele Corsi, Novara (IT); Ezio Bovio, Bellinzago Novarese (IT)

(73) Assignee: GlobalWafers Co., Ltd., Hsinchu (TW)

( * ) Notice: Subject to any disclaimer, the term of this patent is extended or adjusted under 35 U.S.C. 154(b) by 338 days.

(21) Appl. No.: 15/190,624

(22) Filed: Jun. 23, 2016

(65) Prior Publication Data

US 2017/0001281 A1 Jan. 5, 2017

Related U.S. Application Data

(60) Provisional application No. 62/186,821, filed on Jun. 30, 2015.

(51) Int. Cl.
| | |
|---|---|
| *B24B 37/015* | (2012.01) |
| *H01L 21/304* | (2006.01) |
| *B24B 49/14* | (2006.01) |
| *H01L 21/02* | (2006.01) |
| *H01L 21/66* | (2006.01) |

(52) U.S. Cl.
CPC ............ *B24B 37/015* (2013.01); *B24B 49/14* (2013.01); *H01L 21/02024* (2013.01); *H01L 22/12* (2013.01); *H01L 22/26* (2013.01)

(58) Field of Classification Search
None
See application file for complete search history.

(56) References Cited

U.S. PATENT DOCUMENTS

| | | | | |
|---|---|---|---|---|
| 5,643,050 A | * | 7/1997 | Chen .................... | B24B 37/015 451/10 |
| 2002/0037681 A1 | * | 3/2002 | Gitis .................... | B24B 37/013 451/5 |
| 2012/0040592 A1 | * | 2/2012 | Chen .................... | B24B 37/015 451/53 |
| 2015/0224623 A1 | * | 8/2015 | Xu ........................ | B24B 49/105 451/5 |

FOREIGN PATENT DOCUMENTS

JP 2014223293 A * 12/2014

OTHER PUBLICATIONS

Eng Mach Translation of JP 2014 223293, attached as pdf (Year: 2014).*

* cited by examiner

*Primary Examiner* — Brian D Keller
(74) *Attorney, Agent, or Firm* — Armstrong Teasdale LLP

(57) ABSTRACT

A method for varying a removal profile of a silicon wafer during polishing using a polishing apparatus is provided. The polishing apparatus includes a polishing pad, a polishing head assembly configured to hold the silicon wafer, a temperature sensor, and a controller. The method includes receiving, at the controller, thermal data of a portion of the polishing pad from the temperature sensor and determining, by the controller, the removal profile of the silicon wafer based at least in part on the thermal data. The method further includes operating, by the controller, the polishing head assembly to position the silicon wafer in contact with the polishing pad and to selectively vary the removal profile of the silicon wafer based at least in part on the thermal data.

13 Claims, 8 Drawing Sheets

METHODS AND SYSTEMS FOR POLISHING
PAD CONTROL

CROSS-REFERENCE TO RELATED APPLICATIONS

This application claims priority to U.S. Provisional Application No. 62/186,821 filed Jun. 30, 2015, the entire disclosure of which is hereby incorporated by reference in its entirety.

FIELD

This disclosure relates generally to polishing of semiconductor or solar wafers and more particularly to single side polishing apparatus and methods for controlling flatness of the wafer.

BACKGROUND

Semiconductor wafers are commonly used in the production of integrated circuit (IC) chips on which circuitry are printed. The circuitry is first printed in miniaturized form onto surfaces of the wafers. The wafers are then broken into circuit chips. This miniaturized circuitry requires that front and back surfaces of each wafer be extremely flat and parallel to ensure that the circuitry can be properly printed over the entire surface of the wafer. To accomplish this, grinding and polishing processes are commonly used to improve flatness and parallelism of the front and back surfaces of the wafer after the wafer is cut from an ingot. A particularly good finish is required when polishing the wafer in preparation for printing the miniaturized circuits on the wafer by an electron beam-lithographic or photolithographic process (hereinafter "lithography"). The wafer surface on which the miniaturized circuits are to be printed must be flat. Similarly, flatness and finish are also important for solar applications.

Polishing machines typically include a circular or annular polishing pad mounted on a turntable or platen for driven rotation about a vertical axis passing through the center of the pad and a mechanism for holding the wafer and forcing it into the polishing pad. The wafer is typically mounted to the polishing head using for example, liquid surface tension or a vacuum/suction. A polishing slurry, typically including chemical polishing agents and abrasive particles, is applied to the pad for greater polishing interaction between the polishing pad and the surface of the wafer. This type of polishing operation is typically referred to as chemical-mechanical polishing (CMP).

During operation, the pad is rotated and the wafer is brought into contact with and forced against the pad by the polishing head. As the pad wears, e.g., after a few hundred wafers, wafer flatness parameters degrade because the pad is no longer flat, but instead has a worn annular band forming a depression along the polishing surface of the pad. Such pad wear impacts wafer flatness, and may cause "dishing" or "doming" or a combination thereof resulting in a "w-shape".

Some known systems adjust wafer flatness during single-side polishing to change the vacuum used to hold the block to which the wafer is attached in order to introduce a variation of the curvature of the block and the attached wafer. An increase of the vacuum will result in a concave deformation of the block and of the wafer, the wafer edge will be polished more than the wafer center, resulting in a more convex (less concave) wafer. On the contrary, a reduction of the vacuum will result in a more concave (less convex) wafer. This approach assumes that the current wafer shape (concave or convex) produced by the polisher is known. In general, however, the wafer shape is measured after polishing, so that the current wafer shape knowledge always has a delay, resulting in an inaccurate feedback to the vacuum adjustment system.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

In one aspect, a method for varying a removal profile of a silicon wafer during polishing using a polishing apparatus is provided. The polishing apparatus includes a polishing pad, a polishing head assembly configured to hold the silicon wafer, a temperature sensor, and a controller. The method includes receiving, at the controller, thermal data of a portion of the polishing pad from the temperature sensor and determining, by the controller, the removal profile of the silicon wafer based at least in part on the thermal data. The method further includes operating, by the controller, the polishing head assembly to position the silicon wafer in contact with the polishing pad and to selectively vary the removal profile of the silicon wafer based at least in part on the thermal data.

In another aspect, a polishing assembly for polishing of silicon wafers is provided. The polishing assembly includes a polishing pad, a polishing head assembly, a temperature sensor, and a controller. The polishing head assembly holds a silicon wafer to position the silicon wafer in contact with the polishing pad. The polishing head assembly selectively varies a removal profile of the silicon wafer. The temperature sensor collects thermal data from a portion of the polishing pad. The controller is communicatively coupled to the polishing head assembly and the temperature sensor. The controller receives the thermal data from the temperature sensor and selectively varies the removal profile of the silicon wafer based at least in part on the thermal data.

In yet another aspect, a non-transitory computer-readable storage media having computer-executable instructions embodied thereon is provided. When executed by at least one processor, the computer-executable instructions cause the processor to receive thermal data of a portion of a polishing pad from a temperature sensor and determine a removal profile of a silicon wafer based at least in part on the thermal data. The computer-executable instructions cause the processor to operate a polishing head assembly to position the silicon wafer in contact with the polishing pad and to selectively vary the removal profile of the silicon wafer based at least in part on the thermal data.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Like reference symbols in the various drawings indicate like elements.

DETAILED DESCRIPTION

Generally, and in one embodiment of the present disclosure, a wafer that has previously been rough polished so that it has rough front and back surfaces is first subjected to an intermediate polishing operation in which the front surface of the wafer, but not the back surface, is polished to improve flatness parameters or to smooth the front surface and remove handling scratches. To carry out this operation, the wafer is placed against the polishing head. In this embodiment, the wafer is retained in position against the polishing head by surface tension. The wafer also is placed on a turntable of a machine with the front surface of the wafer contacting the polishing surface of a polishing pad.

A polishing head mounted on the machine is capable of vertical movement along an axis extending through the wafer. While the turntable rotates, the polishing head is moved against the wafer to urge the wafer toward the turntable, thereby pressing the front surface of the wafer into polishing engagement with the polishing surface of the polishing pad.

A conventional polishing slurry containing abrasive particles and a chemical etchant is applied to the polishing pad. The polishing pad works the slurry against the surface of the wafer to remove material from the front surface of the wafer, resulting in a surface of improved smoothness. As an example, the intermediate polishing operation preferably removes less than about 1 micron of material from the front side of the wafer.

The wafer is then subjected to a finish polishing operation in which the front surface of the wafer is finish polished to remove fine or "micro" scratches caused by large size colloidal silica, such as Syton® from DuPont Air Products Nanomaterials, LLC, in the intermediate step and to produce a highly reflective, damage-free front surface of the wafer. The intermediate polishing operation generally removes more of the wafer than the finishing polishing operation. The wafer may be finish polished in the same single-side polishing machine used to intermediate polish the wafer as described above. However, a separate single-side polishing machine may also be used for the finish polishing operation. A finish polishing slurry typically has an ammonia base and a reduced concentration of colloidal silica is injected between the polishing pad and the wafer. The polishing pad works the finish polishing slurry against the front surface of the wafer to remove any remaining scratches and haze so that the front surface of the wafer is generally highly-reflective and damage free.

Figure 1:
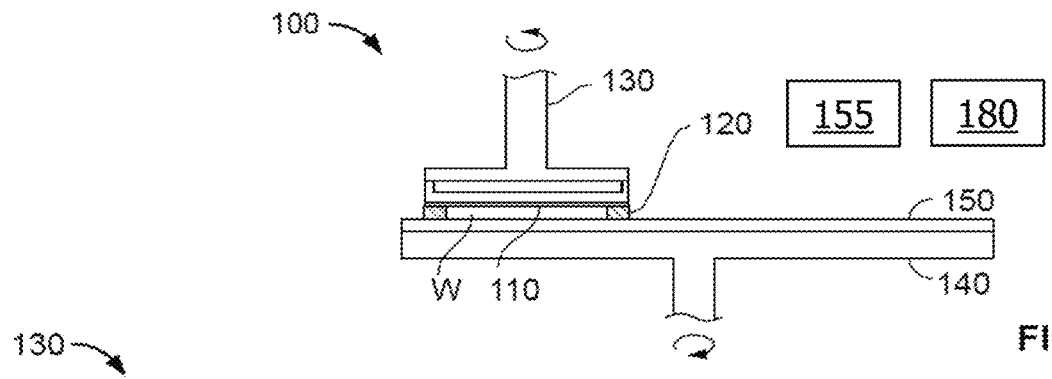
FIG. 1 is a partially schematic elevation of a single side polisher.
Figure 2:
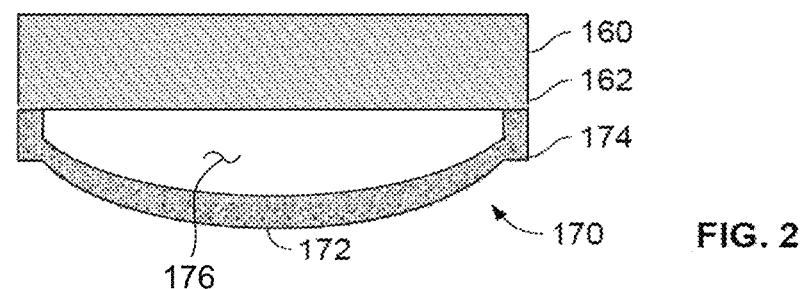
FIG. 2 is a side view of a polishing head assembly in a first configuration implemented by the single side polisher of FIG. 1.

Referring to FIG. 1, a portion of a single side polishing apparatus is shown schematically and indicated generally at 100. The single side polisher 100 may be used to polish a front surface of semiconductor wafers W. It is contemplated that other types of single side polishing apparatus may be used.

The polishing apparatus 100 includes a wafer holding mechanism, e.g., a backing film 110, a retaining ring 120, a polishing head assembly 130, and a turntable 140 having a polishing pad 150. The backing film 110 is located between a polishing head assembly 130 and the retaining ring 120, which receives a wafer W. The retaining ring 120 has at least one circular opening to receive the wafer W to be polished therein. The wafer W of this embodiment is retained against the polishing head assembly 130 by surface tension.

The polishing apparatus 100 applies a force to the polishing head assembly 130 to move the polishing head assembly vertically to raise and lower the polishing head assembly 130 with respect to the wafer W and the turntable 140. An upward force raises the polishing head assembly 130, and a downward force lowers the polishing head assembly. As discussed above, the downward vertical movement of the polishing head assembly 130 against the wafer W provides the polishing pressure to the wafer to urge the wafer into the polishing pad 150 of the turntable 140. As the polishing apparatus 100 increases the downward force, the polishing head assembly 130 moves vertically lower to increase the polishing pressure.

A portion of the polishing head assembly 130 and polishing pad 150 and turntable 140 are rotated at selected rotation speeds by a suitable drive mechanism (not shown) as is known in the art. The rotational speeds of the polishing pad and the turntable may be the same or different. The apparatus 100 includes a controller 155 that controls operation of apparatus 100 as described herein. For example, the controller 155 allows the operator to select rotation speeds for both the polishing head assembly 130 and the turntable 140, and the downward force applied to the polishing head assembly 130.

The apparatus 100 includes a pressurizing source 180 to manipulate a vacuum pressure of the polishing head assembly 130 as described below. In the example embodiment, the controller 155 is communicatively coupled to the pressurizing source 180 to selectively vary the pressure of the polishing head assembly 130.

With reference to FIGS. 2-5, the polishing head assembly 130 includes a polishing head 160 and a cap 170. The cap is suitably made of plastic, aluminum, steel, ceramic, such as alumina or silicon carbide, or any suitable material with sufficient stiffness, including coated silicon.

The cap 170 includes a plate or floor 172 surrounded by an annular wall 174 extending upward therefrom. In use, the backing film 110 attaches the wafer W to the floor 172. In a natural or un-deflected state, the floor 172 has a concave shape (relative to the chamber), such that the center of the floor is lower than the perimeter. In other embodiments, the natural state of the floor 172 may be any shape such as a flat shape or a convex shape (relative to the chamber). The floor 172 is capable of temporarily deflecting without permanently deforming. In the example embodiment, the floor 172 is about 0.118 to about 0.275 inches (3-7 mm) thick, or about 0.625 inches (16 mm) thick for plastic, and has a diameter of about 5.905 to about 6.496 inches (150-165 mm).

The annular wall 174 is rigidly attached to and extends downward from an edge 162 of the polishing head 160. Together the polishing head 160 and the cap 170 form a downwardly domed structure defining a chamber 176. The cap 170 may be attached to the polishing head 160 with bolts or other suitable fasteners. In other embodiments, an adhesive, such as an epoxy, is used to attach the cap 170 to the edge 162 of the polishing head 160.

In the example embodiment, chamber 176 is connected with the pressurizing source 180 to vary the pressure within the chamber 176. The pressure within the chamber 176 is varied to vary the shape of the floor 172. The cap 170 contacts the wafer W. Thus, varying the pressure within the chamber 176 to change the shape of the floor 172 causes a resulting change in the force distribution across the wafer W and thereby causes the wafer to bend in response. The change in force distribution also causes a change in the rate of removal of material from the wafer W. Generally, the rate of removal is increased at portions of the wafer W that transfer relatively greater force to the polishing pad 150.

As a result, the pressure within the chamber 176 may be controlled by the pressurizing source 180 to increase or decrease the shape of the floor 172 of the cap 170 and thereby adjust the amount of doming or dishing of the wafer. As the pressure within the chamber 176 is decreased, the floor 172 transitions from a natural, un-deflected, concave shape (shown in FIG. 2) to a flat shape (shown in FIG. 3) that is substantially parallel with a bottom surface of the polishing head 160, and finally to an upwardly curved or convex shape (shown in FIG. 5).

Figure 3:
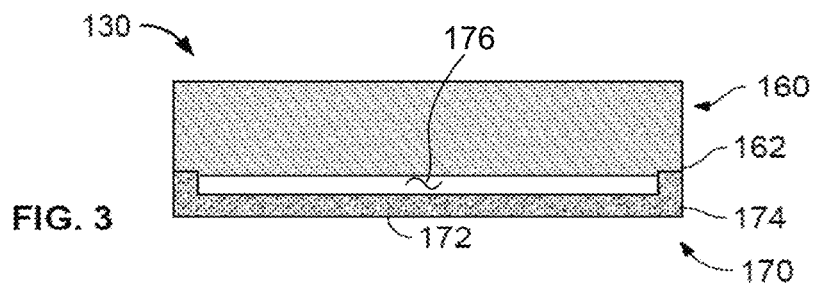
FIG. 3 is a side view of a polishing head assembly in a second configuration implemented by the single side polisher of FIG. 1.
Figure 4:
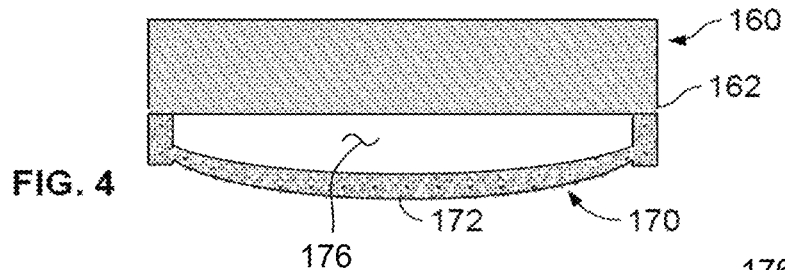
FIG. 4 is a side view of a polishing head assembly in a third configuration implemented by the single side polisher of FIG. 1.
Figure 5:
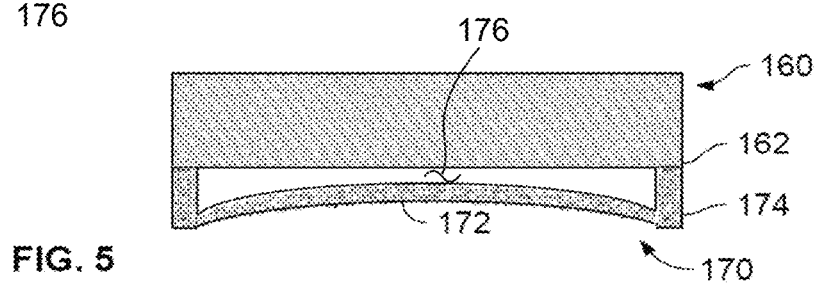
FIG. 5 is a side view of a polishing head assembly in a fourth configuration implemented by the single side polisher of FIG. 1.

As shown in FIG. 3, a given or predetermined pressure P within the chamber 176 shapes the floor 172 to be substantially flat, resulting in a removal profile that is also substantially flat. As shown in FIG. 4, increasing the pressure within the chamber 176 to, for example, 1.1 P causes both the floor 172 and the removal profile to become downwardly curved. As shown in FIG. 5, decreasing the pressure within the chamber to, for example, 0.9 P causes both the shape of the floor 172 and the removal profile to become dished. Suitably, the change in pressure within the chamber 176 may range from about 0.7 P to about 1.3 P. Thus, a change in pressure within the chamber 176 provides an operator with a control variable and the ability to adjust the polished shape of the wafer W. In some embodiments, the predetermined polishing pressure may range from 1.0 psi to 4.0 psi. In other embodiments, the predetermined polishing pressure may be less than 6.0 psi.

In some embodiments, additionally or alternatively, the shape of the floor 172 is controlled by varying the amount of downward pressure on the polishing head assembly. Downward movement of the polishing head assembly 130 toward the polishing pad 150 deflects the floor 172 upward toward the polishing head 160. The direction of deflection is perpendicular to the top surface of the wafer W. As the pressure of the cap 170 against the wafer W increases, the magnitude of deflection of the cap 170 also increases. Regulation of the polishing pressure allows the deflection of the floor 172 to be increased or decreased. As the deflection of the floor 172 is changed, the shape of the floor is also changed. For example, as the polishing pressure is increased, the floor 172 transitions from a natural, un-deflected or downwardly curved or concave shape shown in FIG. 2 to a flat shape shown in FIG. 3 that is substantially parallel with a bottom surface of the polishing head 160, and finally to an upwardly curved or convex shape shown in FIG. 5.

Figure 6:
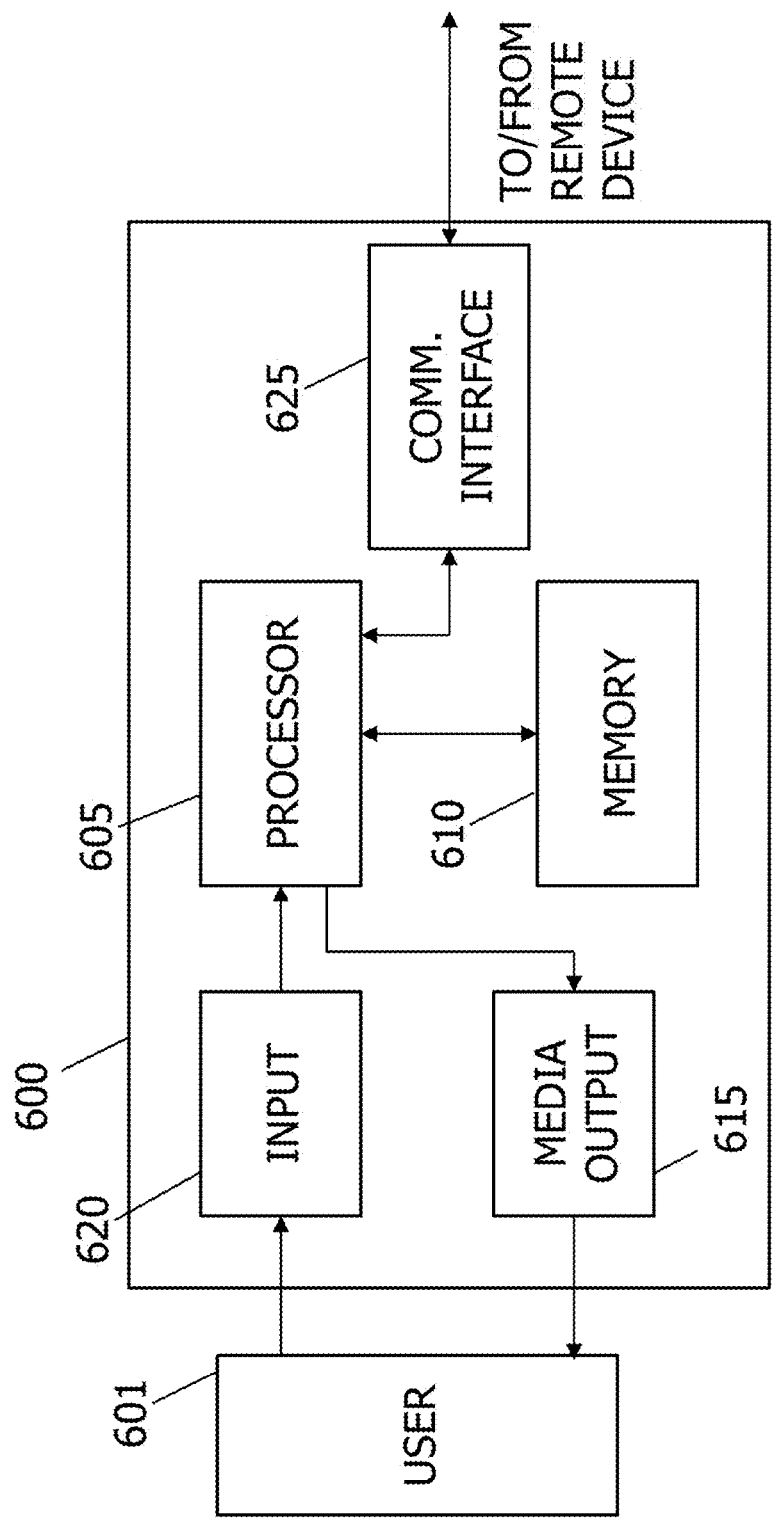
FIG. 6 is a block diagram of an example embodiment of a computing device suitable for use with the single side polisher of FIG. 1.

FIG. 6 is a block diagram of an example embodiment of a computing device 600 suitable for use with the polishing apparatus 100 of FIG. 1. For example, computing device 600 is representative of the controller 155 shown and described above with reference to FIG. 1. The computing device 600 includes a processor 605 for executing instructions. In some embodiments, executable instructions are stored in a memory area 610. The processor 605 may include one or more processing units (e.g., in a multi-core configuration). The memory area 610 is any device allowing information such as executable instructions and/or data to be stored and retrieved. The memory area 610 may include one or more computer readable storage devices or other computer readable media, including transitory and non-transitory computer readable media.

In at least some implementations, the computing device 600 also includes at least one media output component 615 for presenting information to a user 601. The media output component 615 is any component capable of conveying information to the user 601. In some embodiments, the media output component 615 includes an output adapter such as a video adapter and/or an audio adapter. An output adapter is operatively connected to the processor 605 and operatively connectable to an output device such as a display device (e.g., a liquid crystal display (LCD), organic light emitting diode (OLED) display, cathode ray tube (CRT), or "electronic ink" display) or an audio output device (e.g., a speaker or headphones). In some embodiments, at least one such display device and/or audio device is included in the media output component 615.

In some embodiments, the computing device 600 includes an input device 620 for receiving input from the user 601. The input device 620 may include, for example, a keyboard, a pointing device, a mouse, a stylus, a touch sensitive panel (e.g., a touch pad or a touch screen), a gyroscope, an accelerometer, a position detector, or an audio input device. A single component such as a touch screen may function as both an output device of the media output component 415 and the input device 620.

The computing device 600 may also include a communication interface 625, which may be communicatively connected to one or more remote devices. The communication interface 625 may include, for example, a wired or wireless network adapter or a wireless data transceiver for use with a mobile phone network (e.g., Global System for Mobile communications (GSM), 3G, 4G or Bluetooth) or other mobile data network (e.g., Worldwide Interoperability for Microwave Access (WIMAX)).

Stored in the memory area 610 are, for example, processor-executable instructions for providing a user interface to the user 601 via media output component 615 and, optionally, receiving and processing input from the input device 620. The memory area 610 may include, but is not limited to, any computer-operated hardware suitable for storing and/or retrieving processor-executable instructions and/or data. The memory area 610 may include random access memory (RAM) such as dynamic RAM (DRAM) or static RAM (SRAM), read-only memory (ROM), erasable programmable read-only memory (EPROM), electrically erasable programmable read-only memory (EEPROM), and non-volatile RAM (NVRAM). Further, the memory area 610 may include multiple storage units such as hard disks or solid state disks in a redundant array of inexpensive disks (RAID) configuration. The memory area 610 may include a storage area network (SAN) and/or a network attached storage (NAS) system. In some embodiments, the memory area 610 includes memory that is integrated in the computing device 600. For example, the computing device 600 may include one or more hard disk drives as the memory area 610. The memory area 610 may also include memory that is external to the computing device 600 and may be accessed by a plurality of computing devices. The above memory types are exemplary only, and are thus not limiting as to the types of memory usable for storage of processor-executable instructions and/or data.

Figure 7:
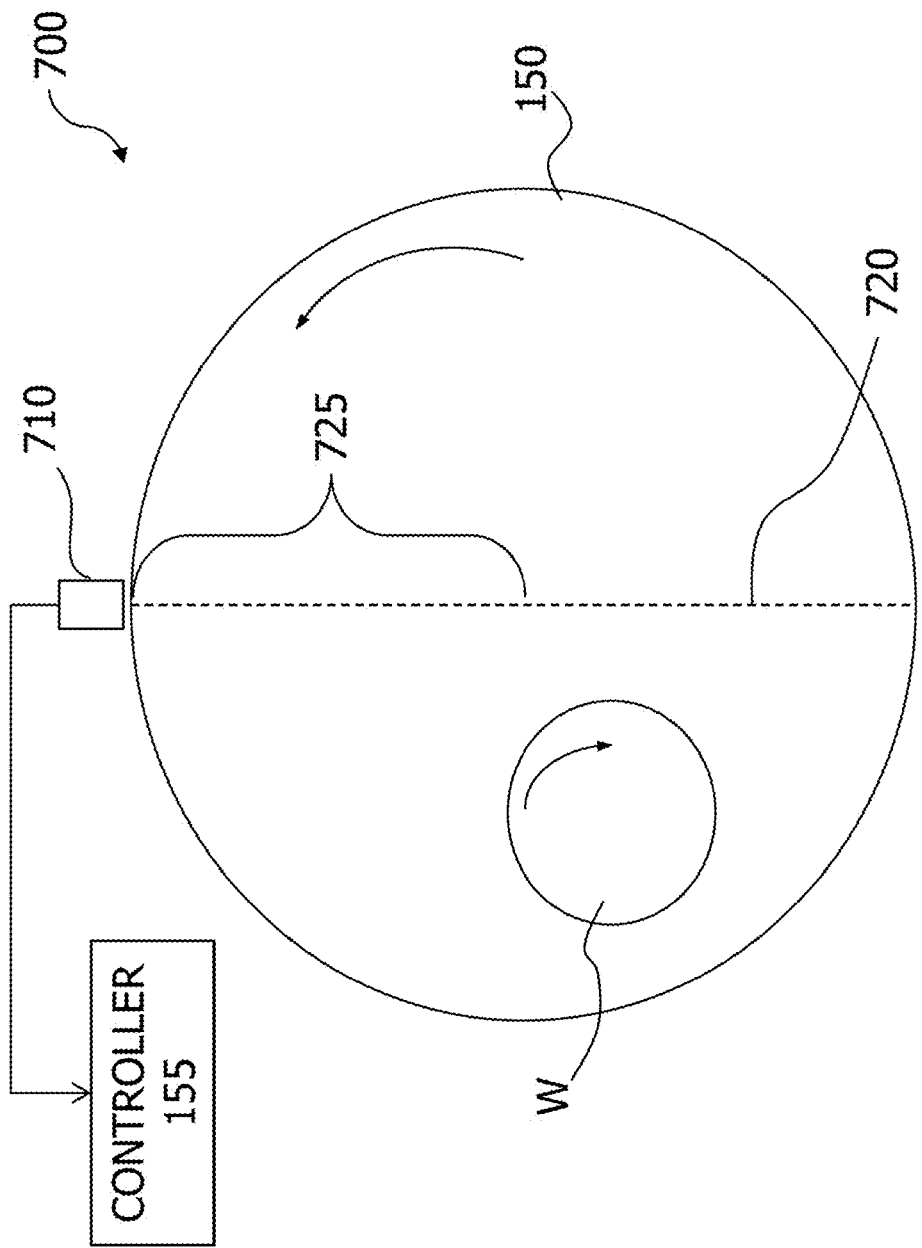
FIG. 7 is a top view of a single side polisher such as the single side polisher of FIG. 1.

FIG. 7 is a top view of part of an example polishing apparatus 700. Polishing apparatus 700 is similar to polishing apparatus 100 and, in the absence of a contrary representation, the same reference numbers identify the same or similar elements. The contact between the polishing apparatus 700 and the wafer W while rotating generates heat in the polishing pad 150. By measuring the radial temperature profile of the polishing pad 150, the current profile of the wafer W may be determined as described below.

The polishing apparatus 700 includes a temperature sensor 710 configured to measure a temperature of the polishing pad 150. The example temperature sensor 710 is positioned adjacent the polishing pad 150. Alternatively, the temperature sensor 710 may be positioned above, below, or integrated in the polishing pad 150. In some embodiments, the polishing apparatus 700 includes a plurality of temperature sensors 710. In the example embodiment, the temperature sensor 710 is an infrared (IR) sensor (e.g., an IR camera). Alternatively, the temperature sensor 710 may be any type of temperature sensor such as, but not limited to, a thermocouple, a resistive temperature device (RTDs), a bimetallic device, a thermometer, a change-of-state sensor, and a silicon diode sensor. The temperature sensor 710 may be coupled to or adjacent the polishing pad 150 in an alternative location (e.g., within the polishing pad 150) to facilitate the temperature sensor 710 capturing thermal data. The thermal data may include, for example, a temperature gradient as a function of distance or time, differential thermal data, a plurality of discrete temperatures, or one or more heat maps. In the example embodiment, the thermal data is transmitted as a temperature gradient over a distance from the edge to the center of the polishing pad 150.

The temperature sensor 710 does not rotate with the polishing pad 150 in the example embodiment. In alternative embodiments, the temperature sensor 710 rotates with the polishing pad 150. The temperature sensor 710 is positioned to capture the thermal data from at least a segment of the polishing pad 150. In some embodiments, the temperature sensor 710 measures the thermal data of a segment along a first diameter 720. In the example embodiment, the temperature sensor 710 measures a temperature of a first radius 725 of the first diameter 720. Alternatively, the temperature sensor 710 may capture the thermal data along other locations of the polishing pad 150 such as a second diameter, a chord, another linear portion of the polishing pad 150, or an area of the polishing pad 150 (e.g., a non-linear portion).

The temperature sensor 710 is communicatively coupled to the controller 155. Alternatively, the temperature sensor 710 may be communicatively coupled to a remote computing device (not shown) in communication with the controller 155. The temperature sensor 710 captures the thermal data and transmits the thermal data to the controller 155 (not shown in FIG. 7). For each wafer, the temperature sensor 710 captures a plurality of sets of thermal data while the wafer is being polished. The controller 155 receives the sets of thermal data from the temperature sensor and generates an average temperature profile (sometimes also referred to as an "average temperature curve") by averaging the sets of thermal data together. In some embodiments, the temperature sensor 710 captures and transmits one set of thermal data. In other embodiments, the temperature sensor 710 captures the thermal data, generates the average temperature profile, and transmits the average temperature profile to the controller 155 in addition to or in place of the thermal data.

The controller 155 is configured to determine the removal profile of the wafer W based on the average temperature profile as described below. If the controller 155 determines that the polishing pad is removing material in a manner that will result in a wafer W that is not flat (i.e., concave or convex), the controller 155 alters the operation of the polishing apparatus 700 such as signaling the pressurizing source 180 to change the pressure with the chamber 176 of the polishing head assembly 130 to make the wafer W flat.

More specifically, the controller 155 controls the removal profile by comparing a differential temperature determined from the average temperature profiles to a reference differential temperature that represents a flat removal profile for a silicon wafer. The controller 155 determines a differential temperature for a wafer W using its average temperature profile. The controller 155 averages the differential temperatures from one or more wafers and compares the averaged differential temperature to the reference differential temperature. By averaging the differential temperatures, the controller 155 does not overcompensate the adjustments of the polishing apparatus 700 in response to data collected from each wafer. If the averaged differential temperature and the reference differential temperature are not substantially the same, the removal profiles of the wafers may not be flat. The controller 155 adjusts the vacuum pressure on the polishing head assembly 130 using the comparison of the differential temperatures as feedback. In the example embodiment, the averaged differential temperature stabilizes at the reference differential temperature.

Figure 8:
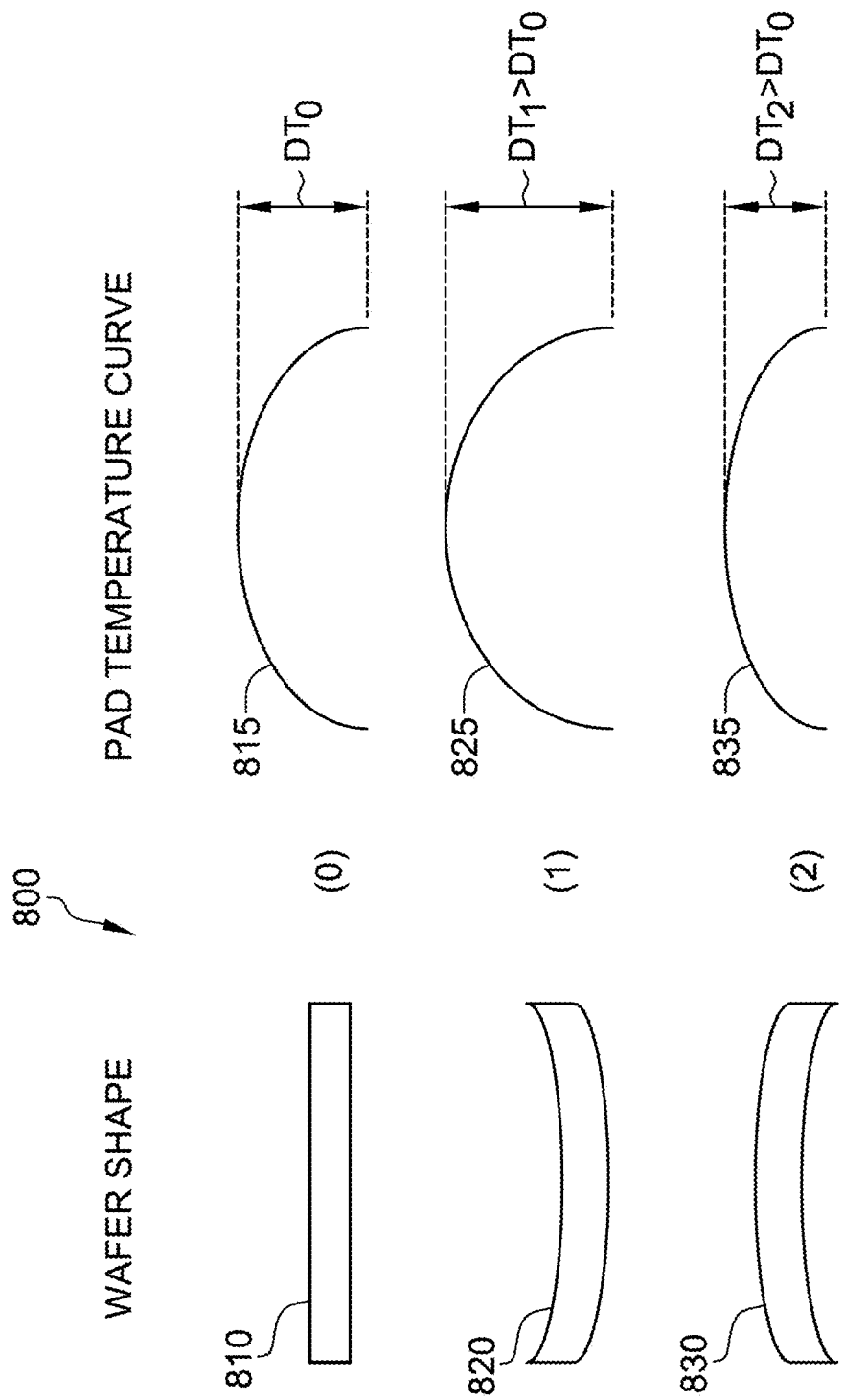
FIG. 8 is an example diagram of a relationship between a removal profile of a silicon wafer and an average temperature curve that may be measured from the single side polisher shown in FIG. 1.

FIG. 8 is an example diagram 800 of the relationship between the removal profile of a wafer and an average temperature curve that may be measured from a single side polishing apparatus shown in FIG. 1. The removal profile is indicated by the differential temperature between the maximum temperature and a lower temperature measured at a distance from the point of the maximum temperature as described further below. In the example embodiment, the wafer is centrally located relative the average temperature curve (i.e., the center of the wafer substantially coincides with the peak of the average temperature curve).

A flat wafer removal profile 810 is indicated by a first differential temperature $DT_0$ of a first average temperature curve 815. As used herein, the first differential temperature $DT_0$ may be referred to generally as a "flat wafer differential temperature". A concave wafer removal profile 820 is indicated by a second differential temperature $DT_1$ of a second average temperature curve 825. The polishing pad is removing more material at the center of the wafer relative to the edges of the wafer in comparison with the flat wafer shape

810, resulting in the second differential temperature $DT_1$ being greater than the first differential temperature $DT_0$. A convex wafer removal profile 830 is indicated by a third differential temperature $DT_2$ of a third average temperature curve 835. The polishing pad is removing less material at the center of the wafer relative to the edges of the wafer in comparison with the flat wafer shape 810, resulting in the third differential temperature $DT_2$ being less than the first differential temperature $DT_0$.

The wafer shapes 810, 820, 830 and the average temperature curves 815, 825, 835 illustrate the general relationship between the wafer removal profile and the differential temperature of the polishing pad. In other embodiments, the wafer shapes 810, 820, 830 and the average temperature curves 815, 825, 835 may be any shapes and/or temperature curves indicating the above relationship.

The first differential temperature $DT_0$ is set as a reference differential temperature for measured differential temperatures. In the example embodiment, the first differential temperature $DT_0$ is determined based on historical data. For example, the first differential temperature $DT_0$ may be an average of past first differential temperatures $DT_0$. In other embodiments, the first differential temperature $DT_0$ may be determined by the temperature of the current wafer. For example, the wafers may be polished until the differential temperature stabilizes or for a set number of wafers and then the current differential temperature is set as the first differential temperature $DT_0$. Alternatively, the first differential temperature $DT_0$ may be a pre-defined value.

Figure 9:
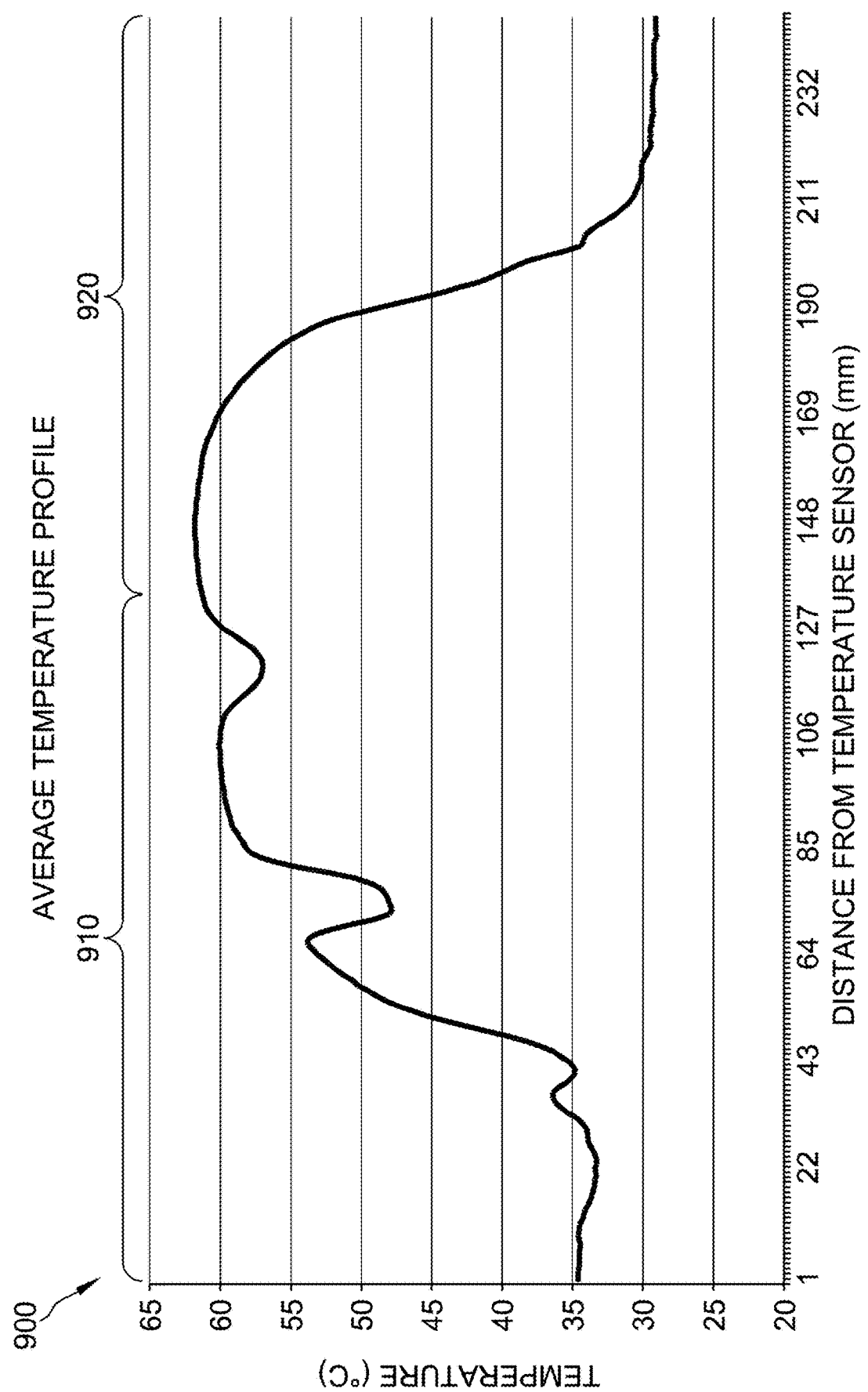
FIG. 9 is an example average temperature profile of a silicon wafer produced by the single side polisher shown in FIG. 1.

FIG. 9 is an example average temperature profile 900 of a wafer produced by a single side polishing apparatus, such as the polishing apparatus 100 shown in FIG. 1. The average temperature profile 900 may be generated by the polishing apparatuses 100, 700 as described herein. Determining a differential temperature based on the average temperature profile 900 enables the controller 155 (shown in FIG. 1) to automatically provide feedback for controlling the polishing head assembly 130 (shown in FIG. 1).

The average temperature profile 900 includes a first portion 910 and a second portion 920. The first portion 910 is upset by the swinging movement of the polishing head assembly 130. For example, a portion of the polishing head assembly 130 may periodically block or overlap the temperature measurement of the temperature sensor 710 (shown in FIG. 7) on the polishing pad 150. Alternatively, the polishing head assembly 130 does not block or overlap the temperature sensor 710. In the example embodiment, the second portion 920 is a smoother curve than the first portion 910. In other embodiments, the first portion 910 and the second portion 920 are reversed (i.e., as the distance increases, the first portion 910 generally decreases and the second portion 920 generally increases). Alternatively, the average temperature curve may include only one portion 910, 920 or a plurality of alternative portions. In the example embodiment, the second portion 920 is used by the controller 155 to determine a differential temperature of the polishing pad 150 (shown in FIG. 1).

Figure 10:
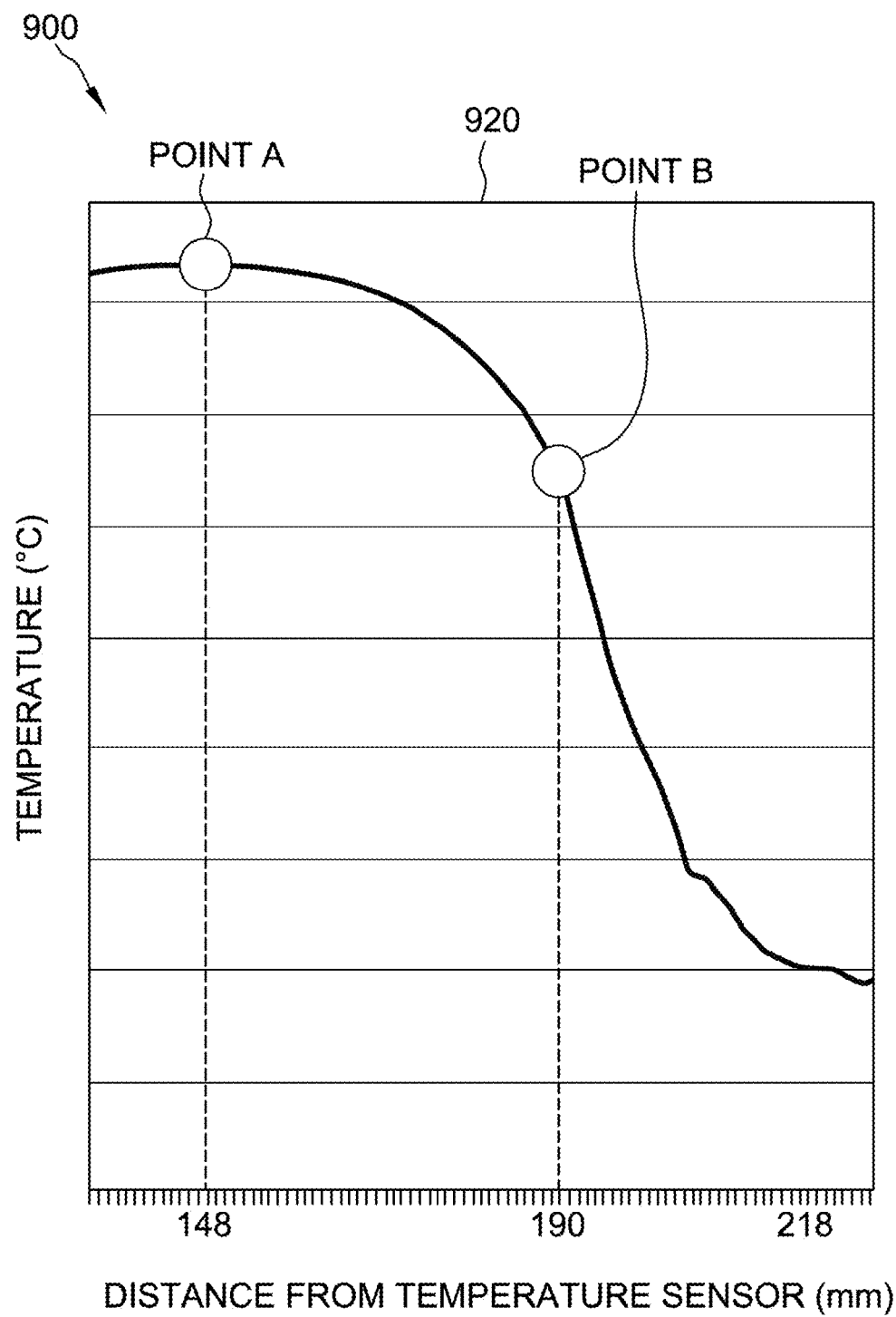
FIG. 10 is a closer view of the average temperature profile shown in FIG. 9 and, more specifically, a second portion of the average temperature profile.

FIG. 10 is an enlarged view of a portion of the average temperature profile 900 and, more specifically, the second portion 920. The controller 155 is configured to determine a wafer shape of the wafer W (shown in FIG. 1) based on analyzing the second portion 920 of the average temperature profile 900.

At least two temperature measurements are used to calculate a differential temperature DT by:

$$DT = T_A - T_B \quad (1)$$

In the example embodiment, the differential temperature DT is calculated using Point A and Point B. Point A is a position $X_A$ with a substantially maximum temperature $T_A$ with respect to the average temperature curve 900. Point B is a position $X_B$ at which the resulting differential temperature DT is reliable. Point B has a temperature $T_B$. In other embodiments, the differential temperature DT is calculated using temperatures from other points. In the example embodiment, Point B is approximately at the curve inflection point of the second portion 920. In some embodiments, Point B may be a fixed distance from Point A. In other embodiments, Point B may be calculated for each wafer or a plurality of wafers.

The controller 155 is configured to dynamically calculate the positions $X_A$ and $X_B$ in order to calculate a differential temperature $DT_i$ for each polished wafer as described below. In some embodiments, the controller 155 may use historical or pre-defined positions $X_A$ and $X_B$.

Equation 2 is used to calculate the position $X_A$ as:

$$X_A = \frac{1}{n}\sum_{i=1}^{n} X_{Tmax,i} \quad (2)$$

The position $X_A$ is the average of the first n maximum temperature positions $X_{Tmax}$ at the beginning of the polishing pad 150's lifetime, where n is equal to the number of polished wafers after which the pad break-in of the polishing pad 150 is completed and a characteristic pad temperature curve of the average temperature profile 900 (i.e., the average temperature profile after the pad break-in) is stabilized. Accordingly, for the first n wafers, the $X_A$ value may change, but after n wafers, $X_A$ may generally become a fixed value for the remaining duration of the polishing pad 150's lifetime. Alternatively, $X_A$ may continually change.

The temperature $T_A$ corresponding to $X_A$ is determined using the average temperature profile 900. In some embodiments, the position $X_A$ may be extrapolated or rounded to a value of the average temperature profile 900. As such, both the position $X_A$ and the temperature $T_A$ may be automatically determined. In the example embodiment, the temperature $T_A$ is averaged to facilitate reduced inconsistent results. For example, the average temperature $T_{A\_avg,i}$ of Point A for each wafer is calculated in Equation 3:

$$T_{A\_avg,i} = \frac{T_{A,i-1} + T_{A,i} + T_{A,i+1}}{3} \quad (3)$$

Temperatures $T_{A,i-1}$, $T_{A,i}$ and $T_{A,i+1}$ corresponding to positions $X_{A,i-1}$, $X_{A,i}$ and $X_{A,i+1}$ for three wafers (e.g., $W_{i-1}$, $W_i$, $W_{i+1}$) are determined and averaged to generate the average temperature $T_{A\_avg,i}$.

The position $X_B$ is determined by Equation 4:

$$X_{B,i} = X_{A,i} + \Delta X_{AB} \quad (4)$$

To calculate the temperature $T_B$ of Point B, an A-B distance $\Delta X_{AB}$ (sometimes referred to as an "A-B offset") is defined. In the example embodiment, the A-B distance $\Delta X_{AB}$ is pre-defined. The A-B distance $\Delta X_{AB}$ may be based on the vertical distance between the temperature sensor 710 (shown in FIG. 7) and the polishing pad 150. In other embodiments, the controller 155 may dynamically determine the A-B distance $\Delta X_{AB}$ such as, for example, using curve analysis to identify the curve inflection point of the average temperature profile 900. Alternatively, the A-B distance $\Delta X_{AB}$ may be based on historical data of the A-B distance $\Delta X_{AB}$. Hence, the position $X_B$, for each wafer, is the sum the position $X_A$ and the A-B distance $\Delta X_{AB}$ as expressed in Equation 4. Equation 4 is:

The temperature $T_B$ for each wafer may be determined with the position $X_B$. In the example embodiment, similar to the average temperature $T_{A\_avg}$, an average temperature $T_{B\_avg}$ is calculated for each wafer using Equation 5:

$$T_{B\_avg,i} = \frac{T_{B,i-1} + T_{B,i} + T_{B,i+1}}{3} \quad (5)$$

Similar to Equation 3, Equation 5 averages temperatures $T_{B,i-1}$, $T_{B,i}$ and $T_{B,i+1}$ to produce the average temperature $T_{B\_avg}$.

Once the temperatures $T_{A\_avg}$ and $T_{B\_avg}$ are determined for each wafer, the differential temperature $DT_i$ for each wafer may be computed by Equation 6:

$$DT_i = T_{A\_avg,i} - T_{B\_avg,i} \quad (6)$$

In the example embodiment, the last k differential temperatures DT are used to calculate an average differential temperature $DT_{avg}$ to be compared to the flat wafer differential temperature $DT_0$ shown in FIG. 8. Averaging the last k differential temperatures enables the controller 155 to adjust the removal profile of the subsequent wafers without overcompensating for minor variations of the differential temperature of the current wafer. In other embodiments, the average differential temperature $DT_{avg}$ is not calculated and each wafer's actual differential temperature DT is compared to the flat wafer differential temperature $DT_0$. The average differential temperature is calculated as:

$$DT_{avg} = \frac{1}{k}\sum_{i=1}^{k} DT_i = \frac{DT_1 + DT_2 + \ldots + DT_k}{k} \quad (7)$$

where k is usually equal to the number polished wafers.

The controller 155, using the flat wafer differential temperature $DT_0$ as a reference, determines if the average differential temperature $DT_{avg}$ indicates a flat wafer removal profile. In the example embodiment, the controller 155 selectively varies the pressure within the chamber 176 of the polishing head assembly 130 to alter the removal profile of the wafer W.

Figure 11:
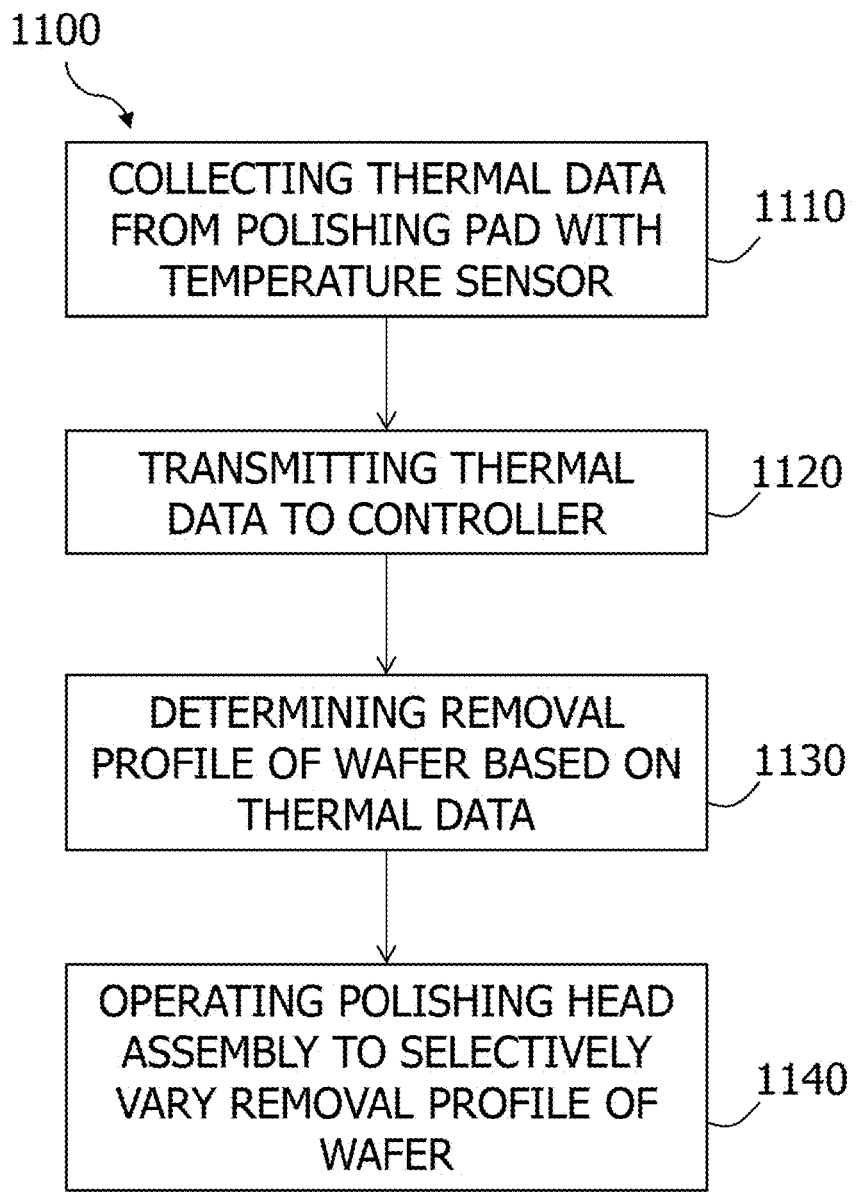
FIG. 11 is a method for varying a removal profile of a wafer during polishing using the polishing apparatus shown in FIG. 1.

FIG. 11 is a method 1100 for varying a removal profile of a wafer during polishing using a polishing apparatus shown in FIG. 1. The polishing apparatus collects thermal data from a polishing pad and varies the removal profile of the wafer based at least in part on the thermal data. The method may include additional, fewer, or alternate actions, including those discussed elsewhere herein.

The method begins with a temperature sensor collecting 1110 thermal data from a portion of a polishing pad. In the example embodiment, the portion of the polishing pad is a radius of the polishing pad. The temperature sensor transmits 1120 the thermal data to a controller. The controller determines 1130 the removal profile of the wafer based at least in part on the thermal data.

In the example embodiment, the controller generates an average temperature profile for the wafer using the thermal data. The controller determines a differential temperature of the average temperature profile. After a set of wafers have been polished and a differential temperature is determined for each wafer, an averaged differential temperature is calculated. The averaged differential temperature is compared to a reference differential temperature such as a flat wafer differential temperature. In other embodiments, the averaged differential temperature is not calculated and each differential temperature is compared to the reference differential temperature separately. The controller may compute the reference differential temperature based on the thermal data and/or the differential temperatures of the wafers. Alternatively, the controller stores a pre-defined reference differential temperature.

The differences between the averaged differential temperature and the reference differential temperature indicate the removal profile of the wafer. For example, if the reference differential temperature is a flat wafer differential temperature, if the averaged differential temperature is greater than the reference differential temperature, the averaged differential temperature may indicate a concave removal profile. If the averaged differential temperature is lower than the reference differential temperature, the averaged differential temperature may indicate a convex removal profile.

The controller operates 1140 a polishing head assembly to position the silicon wafer in contact with the polishing pad and to selectively vary the removal profile of the silicon wafer. The removal profile is varied to generally approach a reference removal profile (e.g., a flat removal profile) indicated by the reference differential temperature. Alternatively, the removal profile may be varied to a different removal profile. In the example embodiment, the controller communicates with a pressurizing source to vary a pressure within a cap of the polishing head assembly that is in contact with the wafer. The changing pressure causes the cap to change shape and the removal profile of the wafer to change in response. In some embodiments, the controller may communicate to the polishing head assembly to increase or decrease a polishing pressure on the wafer. Alternatively, the controller may change the rotation speed of the polishing head assembly and/or the polishing pad.

Figure 12:
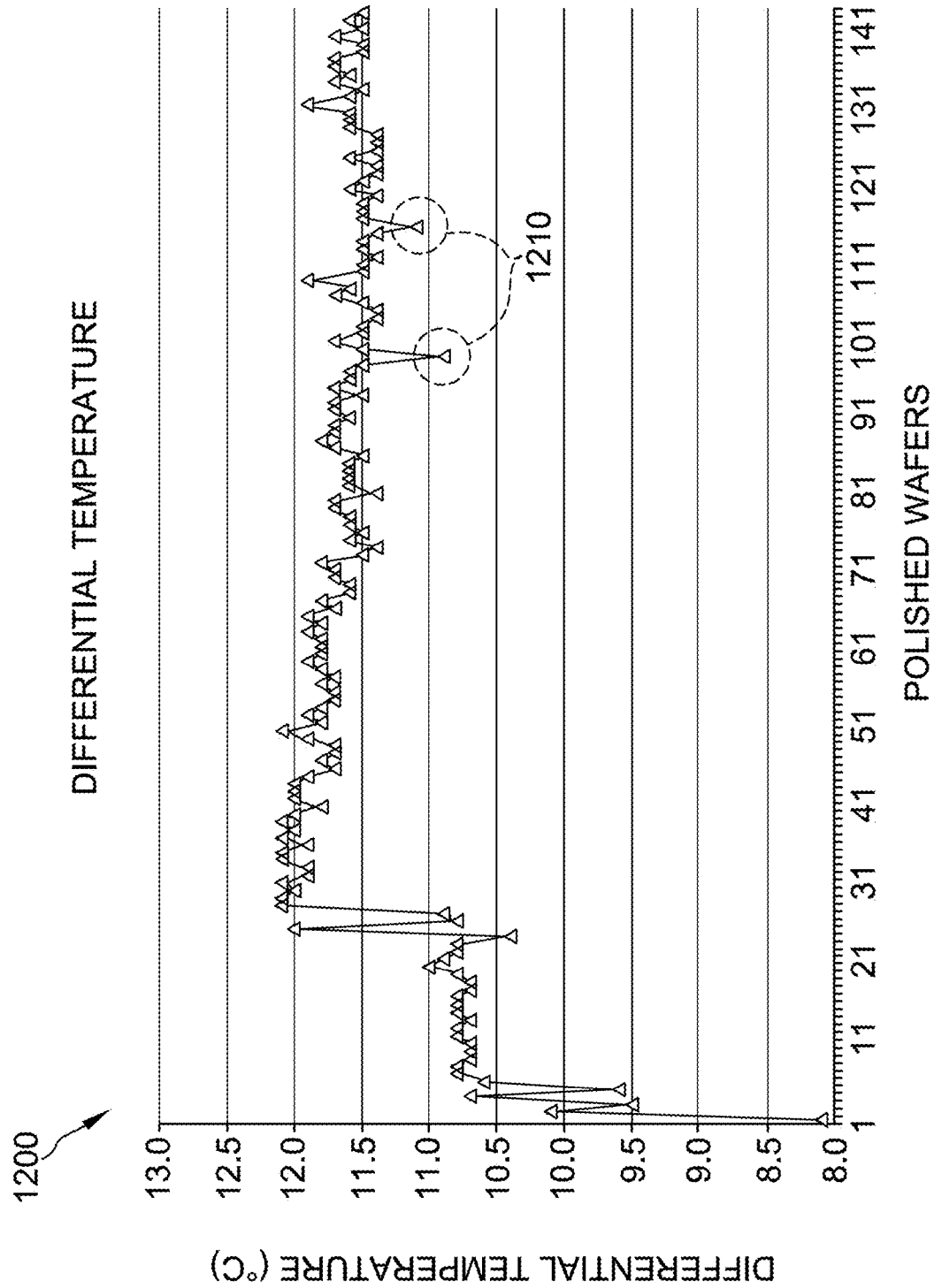
FIG. 12 is a graph of an example experiment using the single side polisher shown in FIG. 1.

FIG. 12 is a graph 1200 of an example experiment using a single side polishing apparatus shown in FIG. 1. The graph 1200 illustrates the differential temperature of each of a plurality of wafers over a polishing pad's lifetime. The example experiment implemented a method such as the method 1100 shown in FIG. 11 to control the removal profiles of the plurality of wafers using a polishing pad's temperature.

In the example experiment, the differential temperatures of the initial wafers vary more than the later wafers. The initial variance may be caused by the pad break-in and/or a pre-existing rough, convex, or concave surface on the wafer. After approximately 30 wafers, the differential temperature DT becomes stable as the differential temperature approaches the flat wafer differential temperature $DT_0$. The differential temperature DT may stabilize after more or fewer number of wafers.

In the example experiment, some differential temperature values may be considered as "outliers". For example, the graph 1200 includes outliers 1210. The outliers 1210 generally occur when the polishing apparatus is idling and the pad temperature drops. The initial wafers exhibited a lower differential temperature during pad break-in. The outliers 1210 may lead to inconsistent data such as, for example, in embodiments in which the flat wafer differential temperature $DT_0$ and/or the average differential temperature $DT_{avg}$ are based on historical or current thermal data.

In order to reduce and/or remove outliers 1210, a threshold temperature $T_{Thre}$ may be determined as described below. In the example embodiment, the threshold temperature $T_{Thre}$ is a dynamic value updated for each wafer. Alternatively, the threshold temperature $T_{Thre}$ may be a fixed value such as a pre-defined value. The threshold temperature $T_{Thre}$ is compared to a temperature value of the average temperature profile of a wafer to determine if the thermal data of the wafer is an outlier 1210. The threshold temperature $T_{Thre}$ enables a controller to discard temperature readings below that limit. In other embodiments, a temperature range may be determined. In the example embodiment, the threshold temperature $T_{Thre}$ is not implemented until the differential temperature of the polishing pad has stabilized (i.e., after the pad break-in). Alternatively, the threshold temperature $T_{Thre}$ may be implemented for the duration of the polishing pad's lifetime.

An effective temperature $T_{Eff}$ of the current wafer is calculated in Equation 8 as:

$$T_{Eff,i} = \frac{1}{\Delta X_{AB}} \int_{X_A}^{X_B} T_i dx \quad (8)$$

Using the values from calculating the differential temperature DT of each wafer, the effective temperature $T_{Eff}$ of the current wafer is the average temperature between the position $X_A$ of the point A and the position $X_B$ of the point B, where $T_i$ is an average temperature profile of the current wafer. The effective temperature $T_{Eff}$ is used to calculate a threshold temperature $T_{Thre}$ and compared to the threshold temperature $T_{Thre}$. If the effective temperature $T_{Eff}$ is less than the threshold temperature $T_{Thre}$, the current wafer's temperature measurements may not be representative of the current wafer's removal profile (e.g., the polishing pad is idling).

The threshold temperature is expressed by Equation 9:

$$T_{Thre} = \frac{C}{n} \sum_{j=i-1}^{i-1-n} T_{Eff,j} \quad (9)$$

where n is generally the number of wafers for the pad break-in, and C is a correction factor lower than 1. In some embodiments, n is a different value than the number of wafers for pad break-in. By averaging the last n effective temperature $T_{Eff}$ values and applying the correction factor C, the threshold temperature $T_{Thre}$ is determined.

In the example embodiment, when the effective temperature $T_{Eff}$ of the current wafer is lower than the threshold temperature $T_{Thre}$ the corresponding differential temperature DT is discarded and replaced with the last valid DT to compute the $DT_{avg}$. In other embodiments, the corresponding differential temperature DT is replaced an alternative differential temperature.

The embodiments described herein provide the ability to vary a removal profile of a silicon wafer based on thermal data of a portion of the polishing pad to enable an efficient and economical polishing method of processing semiconductor wafers. The method facilitates improved wafer yield and process capability, while reducing product tolerances and the time needed to identify convex or concave removal profiles. Another advantage of using the embodiments described herein includes the ability to automate adjustments to the removal profile by compensating for initially uneven wafer surfaces by modulating the shape of a polishing head of the polishing assembly and using the thermal data as feedback.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements. The use of terms indicating a particular orientation (e.g., "top", "bottom", "side", "down", "up", etc.) is for convenience of description and does not require any particular orientation of the item described.

As various changes could be made in the above constructions and methods without departing from the scope of the invention, it is intended that all matter contained in the above description and shown in the accompanying drawing[s] shall be interpreted as illustrative and not in a limiting sense.

What is claimed is:

1. A method for varying a removal profile of a silicon wafer during polishing using a polishing apparatus comprising a polishing pad having a surface for contacting the silicon wafer, a polishing head assembly configured to hold the silicon wafer, a temperature sensor, and a controller, the method comprising:
   placing the silicon wafer in the polishing apparatus;
   receiving, at the controller, sets of thermal data of a portion of the polishing pad from the temperature sensor, each set of thermal data comprising temperature measurements for different points on the surface of the polishing pad, and each set of thermal data being collected from a polishing operation on a different silicon wafer;
   determining an average temperature profile of the portion of the polishing pad by averaging, for each point of the different points, the temperature measurements from the sets of thermal data;
   determining, by the controller, the removal profile of the silicon wafer based at least in part on the average temperature profile, wherein the removal profile comprises a cross sectional profile of the silicon wafer;
   operating, by the controller, the polishing head assembly to position the silicon wafer in contact with the polishing pad and to selectively vary the removal profile of the silicon wafer based at least in part on the average temperature profile; and
   polishing the silicon wafer using the polishing pad.

2. The method of claim 1, wherein receiving the sets of thermal data of the polishing pad from a temperature sensor comprises receiving the sets of thermal data of the polishing pad from an infrared (IR) camera.

3. The method of claim 1, wherein the polishing head assembly comprises a polishing head and a cap, wherein the cap selectively varies the removal profile of the silicon wafer.

4. The method of claim 3, wherein the cap defines a chamber, wherein the polishing head assembly selectively varies the removal profile of the silicon wafer by regulating the pressure within the chamber.

5. The method of claim 4, wherein the chamber is connected to a pressurizing source, the method further comprising regulating the pressure within the chamber with the pressurizing source.

6. The method of claim 5, wherein the cap includes a floor, wherein regulating the pressure within the chamber with the pressurizing source selectively varies the removal profile of the silicon wafer by regulating the shape of the floor.

7. The method of claim 1, wherein the temperature sensor is located adjacent to the polishing pad.

8. The method of claim 1, wherein the temperature sensor is positioned to capture the sets of thermal data with the different points on the surface of the polishing pad being located along a radius of the polishing pad.

9. A method for varying a removal profile of a silicon wafer during polishing using a polishing apparatus comprising a polishing pad having a surface for contacting the silicon wafer, a polishing head assembly configured to hold the silicon wafer, a temperature sensor, and a controller, the method comprising:
placing the silicon wafer in the polishing apparatus;
receiving, at the controller, sets of thermal data of a portion of the polishing pad from the temperature sensor, each set of thermal data comprising temperature measurements for different points on the surface of the polishing pad, and each set of thermal data being collected from a polishing operation on a different silicon wafer;
determining an average temperature profile of the portion of the polishing pad by averaging, for each point of the different points, the temperature measurements from the sets of thermal data;
determining a differential temperature between two points of the different points in the average temperature profile;
determining, by the controller, the removal profile of the silicon wafer based on the average temperature profile, wherein the removal profile comprises a cross sectional profile of the silicon wafer;
operating, by the controller, the polishing head assembly to position the silicon wafer in contact with the polishing pad and to selectively vary the removal profile of the silicon wafer by comparing the determined differential temperature to a reference differential temperature; and
polishing the silicon wafer using the polishing pad.

10. The method of claim 9, wherein receiving the sets of thermal data of the polishing pad from a temperature sensor comprises receiving the sets of thermal data of the polishing pad from an infrared (IR) camera.

11. The method of claim 9, wherein the different points on the surface of the polishing pad are located along a radius of the polishing pad.

12. The method of claim 9, wherein the polishing head assembly comprises a polishing head and a cap, and wherein the cap selectively varies the removal profile of the silicon wafer.

13. The method of claim 12, wherein the cap defines a chamber, and wherein the polishing head assembly selectively varies the removal profile of the silicon wafer by regulating the pressure within the chamber.

* * * * *